(12) United States Patent
Gelbart

(10) Patent No.: US 6,266,134 B1
(45) Date of Patent: Jul. 24, 2001

(54) SYSTEM FOR EXPOSING PHOTOPOLYMER WITH LIGHT FROM COMPACT MOVABLE LIGHT SOURCE

(75) Inventor: Daniel Gelbart, Burnaby (CA)

(73) Assignee: Creo Products Inc., Burnaby (CA)

( * ) Notice: Subject to any disclaimer, the term of this patent is extended or adjusted under 35 U.S.C. 154(b) by 0 days.

(21) Appl. No.: 09/477,378

(22) Filed: Jan. 4, 2000

Related U.S. Application Data

(63) Continuation-in-part of application No. 09/009,249, filed on Jan. 20, 1998.

(51) Int. Cl.⁷ ............................ G03B 27/60; B29C 35/04; G03C 1/76
(52) U.S. Cl. ........................ 355/73; 264/401; 430/270.1
(58) Field of Search ............................. 355/73; 118/620; 424/66; 264/22, 401; 430/270.1, 270.11, 292, 300, 331

(56) References Cited

U.S. PATENT DOCUMENTS 5,096,530  3/1992  Cohen .
5,171,490  12/1992  Fudim .
5,772,947 * 6/1998  Hull et al. ........................... 264/401

* cited by examiner

Primary Examiner—Russell Adams
Assistant Examiner—Peter B. Kim
(74) Attorney, Agent, or Firm—Oyen Wiggs Green & Mutala

(57) ABSTRACT

An exposure system for liquid photopolymer printing plates has a small movable illumination source. The illumination source moves to expose all of a photopolymer object, such as a printing plate being exposed. The area covered by the light source can be adjusted to match the area of the printing plate. The system does not require a large uniform source of illumination. The collimation of the light source is variable. This permits control over the cross sectional profile of exposed features in the photopolymer. Preferably a flat horizontal glass plate supported by air pressure supports the photopolymer being exposed. An optical sensor and a control system are used in preferred embodiments to keep the plate flat by controlling air pressure in an enclosure beneath the plate.

17 Claims, 4 Drawing Sheets

SYSTEM FOR EXPOSING PHOTOPOLYMER WITH LIGHT FROM COMPACT MOVABLE LIGHT SOURCE

CROSS REFERENCE TO RELATED APPLICATION

This is a continuation in part of application Ser. No. 09/009,249 filed Jan. 20, 1998 and entitled EXPOSURE SYSTEM FOR LIQUID PHOTOPOLYMER PRINTING PLATES.

FIELD OF THE INVENTION

This invention relates to apparatus and methods for making plates from liquid polymer by supporting a liquid polymer on a flat surface and then selectively curing the liquid polymer by exposure to actinic radiation. The invention is particularly useful for making photopolymer flexographic printing plates.

BACKGROUND OF THE INVENTION

In many industries solid plates (also referred to as sheets) of polymer are made by pouring a liquid polymer onto a flat horizontal surface, letting the liquid polymer level under the influence of gravity and curing it to form a solid. The liquid "polymer" may be a polymerizable material which is not itself a polymer according to the literal meaning of the word polymer. Typically the material may be selectively solidified, or may have its solubility in a solvent altered, by exposure to actinic radiation.

Some polymers can be cured by exposure to actinic radiation such as ultraviolet (UV) light. When the curing is done by UV light, the polymer is referred to as a photopolymer. Photopolymers can be selectively cured by placing an exposed and developed film under the liquid polymer layer shining a light on the underside of the polymer layer and using an image on the film to control the amounts of light reaching different parts of the polymer. Flexographic printing plates and letter press polymeric printing plates can be prepared in this manner.

Prior art systems provide an ultraviolet light source which has dimensions approximately equal to those of the largest printing plate to be cured. The light source evenly illuminates an under side of a large support plate, which is typically a thick sheet of glass. To make a plate, liquid polymer is poured on an upper surface of the support plate. The upper surface of the support place provides a flat base surface for the polymer.

Such prior art systems have two main disadvantages. First, providing a large light source capable of evenly illuminating each portion of the support plate is expensive and is wasteful in cases where the polymer plates to be made are significantly smaller than the support plate.

Secondly, support plates must generally be thick to reduce sagging. Any large glass plate which is supported around its edges tends to sag in its center. The sag of the glass support plate causes the finished polymer plate to be thicker in its middle area. This is because the top surface of the polymer is always flat due to the liquid levelling itself, while the bottom follows the glass support plate. To achieve a desired thickness uniformity of, for example, 25 microns (0.001") over an area of a few square meters, special measures must be taken to support the weight of the glass. Thicknesses of 15 mm or more are common. A thick support plate tends to attenuate radiation which is passing through it. Therefore, a powerful illumination source is typically required for curing polymer printing plates.

An additional problem occurs when such prior systems are used to image photopolymer plates. Such systems typically offer little control over the cross sectional profiles of features in the imaged plates.

There is a need for apparatus and methods for curing photopolymer plates which are more efficient and less expensive than current methods and apparatus. There is also a need for a system which provides enhanced control over the cross sectional profiles of features in imaged photopolymer plates.

SUMMARY OF THE INVENTION

This invention provides apparatus for curing a photopolymer in which a light source is moved relative to the photopolymer to expose the photopolymer. The light source preferably emits collimated light. This allows the generation of sharper flexographic printing plates, as the collimated light will cast sharper shadows of an image on a masking film than would uncollimated light. In preferred embodiments of the invention, the collimation of the light source may be adjusted to control the form of the edges of imaged regions of the plates and the resulting cross sectional profiles of imaged features. If a small sheet of polymer is being made then the light source may be scanned over a region which is smaller than, and lies within, the maximum area over which the light source can be scanned. This improves efficiency.

While the invention may be used for the manufacturing of any solid polymer object from liquid polymer, the preferred embodiment relates to flexographic printing plates. An exposure system according to this invention may be used to expose plates made from liquid photopolymer or plates made from unexposed solid gel-like photopolymer (which are also known as "rigid plates").

One aspect of the invention provides a method for exposing a photopolymer, such as a printing plate. The method comprises providing a light source; providing a layer of a photopolymer; and, operating the light source to generate ultraviolet light and exposing the photopolymer to the ultraviolet light while moving the light source in at least two dimensions to evenly expose the photopolymer to the ultraviolet light. The light source preferably comprises an arc lamp. Most preferably the light source has variable collimation.

In preferred embodiments the method comprises: providing first and second masks having areas substantially opaque to ultraviolet light and areas substantially transparent to ultraviolet light, the transparent areas in the first mask corresponding to and being slightly larger than the transparent areas in the second mask; inserting the first mask between the light source and the photopolymer layer, and exposing the photopolymer layer to ultraviolet light from the light source with the collimator set to provide light of a first degree of collimation incident on the mask; and, inserting the second mask between the light source and the photopolymer layer, and exposing the photopolymer layer to ultraviolet light from the light source with the collimator set to provide light of a second degree of collimation, less than the first degree of collimation, incident on the mask. The steps of inserting the first mask and inserting the second mask are performed in any order. This provides the ability to better control the cross sectional profiles of exposed features.

Another aspect of the invention provides apparatus for curing a photopolymer. The apparatus comprises: a light source which emits actinic radiation, such as ultraviolet light, when energized; a movable stage supporting the light source, the movable stage capable of moving the light source in at least two dimensions on a surface of motion; and, a support surface for supporting a photopolymer plate, the support surface parallel to the surface of motion of the light source. In some preferred embodiments the light source comprises an arc lamp and a reflector and the arc lamp is movable relative to the reflector to allow a collimation of light emitted by the light source to be adjusted. The movable stage is preferably controlled by a computer controller. The controller preferably permits a user to select an area over which the light source is scanned. The computer controller may scan the light source in a pattern including a plurality of parallel lines.

Further features and advantages of the invention are described below.

BRIEF DESCRIPTION OF DRAWINGS

In drawings which illustrate non-limiting embodiments of the invention.

DESCRIPTION OF THE PREFERRED EMBODIMENT

Figure 1:
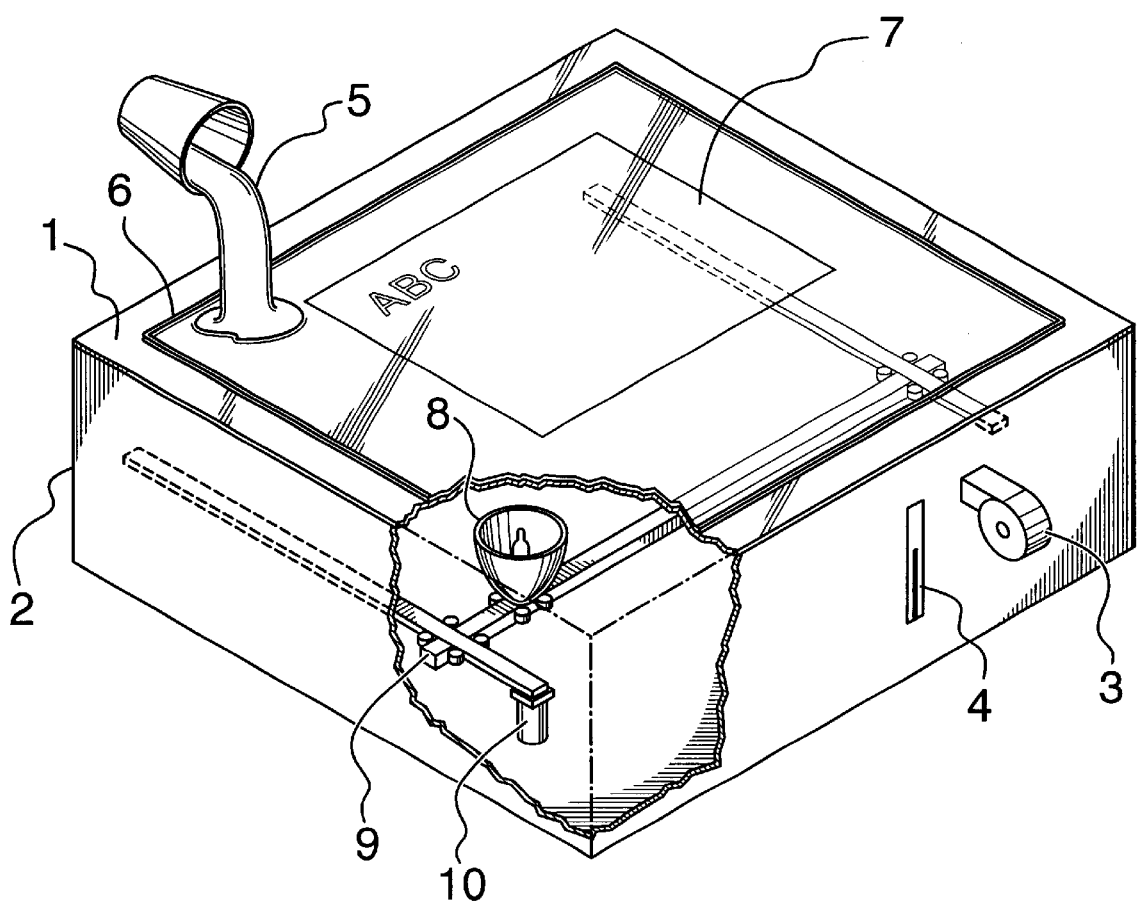
FIG. 1 is an overall isometric view of an apparatus according to the invention.

As shown in FIG. 1, a first aspect of the invention provides a flat support plate upon which a polymer plate may be made from a liquid polymer. A flat support plate 1 forms a top surface of an enclosure 2. Plate 1 can be made of various materials which are transparent to the actinic radiation which will be used to expose the polymer to be used. However, glass is a preferred material for support plate 1 because it is readily available and relatively low in cost. Support plate 1 transmits radiation, typically ultraviolet light, which is used to expose a layer of a photopolymer 5 which is supported on top of support plate 1. A masking film 7 blocks radiation from reaching some areas of photopolymer 5 and permits radiation to expose other areas of photopolymer 5.

It is desired to maintain the surface of support plate 1 flat. While this could be done by making support plate 1 thick and, consequently, rigid, this is not desirable because thick support plates are heavy, expensive and absorb more actinic radiation than would be desired. An air blower 3 slightly pressurizes the inside of enclosure 2 to counter-balance the weight of glass support plate 1 and the thin layer of polymer 5 which is supported by plate 1. The amount of over pressure inside enclosure 2 may be very slight and can be calculated from the following formula:

$$P=2.7 \times TG+1.2 \times TP \quad (1)$$

Where P is the air pressure differential between the interior and exterior of enclosure 2 (in mm of water); TG is the thickness of glass used for plate 1 (in mm); and TP is the thickness of the layer of polymer 5 (in mm). This assumes density of 2.7 (relative to water) for glass and 1.2 for the polymer. For materials of different densities the multipliers in equation (1) will be different. By way of example, a 6 mm glass plate with a 3 mm layer of polymer requires a compensating pressure of $2.7 \times 6 + 1.2 \times 3 = 19.8$ mm of water. Since atmospheric pressure is approximately 10,000 mm of water, this pressure is only 0.2% of atmospheric. Such a low positive pressure can be supplied by a very small blower (similar to the blower used in hand-held hair dryers). Enclosure 2 need not be sealed very well as long as the blower has sufficient excess capacity to overcome any slight air leaks. Any suitably controllable source of pressurized air or other gas may be used in place of a blower to pressurize the interior of enclosure 2. The air pressure within enclosure 2 may be monitored via a pressure gauge 4.

For bulk, (i.e. non-selective) polymerization the liquid layer is polymerized by directing UV light (or other suitable actinic radiation) at photopolymer layer 5. For bulk polymerization the light may be directed at the photopolymer either from above or below. For selective photopolymerization a masking film 7 is placed over support plate 1. Film 7 has some areas which are substantially opaque and other areas which allow light to pass through into photopolymer 5. Film 7 is typically an exposed and processed photographic film. The liquid polymer is poured on top of film 7. Sometimes a very thin transparent cover sheet is used to prevent film 7 from adhering to polymer 5. Film 7 controls which areas of photopolymer 5 are exposed to the UV light. The polymer in non-polymerized areas is washed off later on during processing. Film 7 may cover an area significantly smaller than the area of support plate 1.

A raised border 6 prevents spillage of polymer 5.

Figure 4:
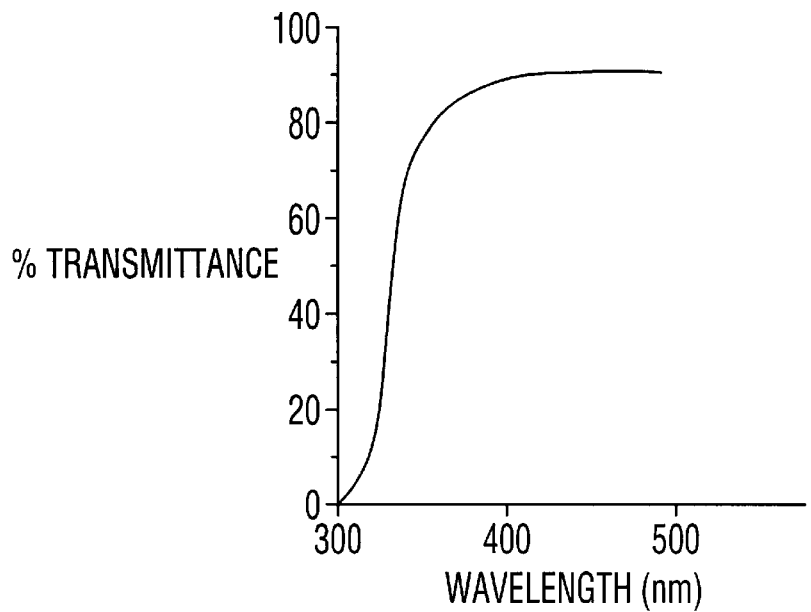
FIG. 4 is a graph which illustrates the transmission of ultraviolet light through a glass plate as a function of wavelength.

Support plate 1 must not be opaque to UV light for any applications involving exposure from a UV light source located below support plate 1. The best material for UV transmittance is fused silica, however, fused silica is expensive. Regular glass can be used for support plate 1 if some light loss (typically 30%–60%) can be tolerated. This invention allows the use of thin glass which allows more UV light to pass than the thick glass which is required in prior similar devices. FIG. 4 is a graph which illustrates the transmission of ultraviolet light through a glass plate as a function of the wavelength of the light.

Figure 2:
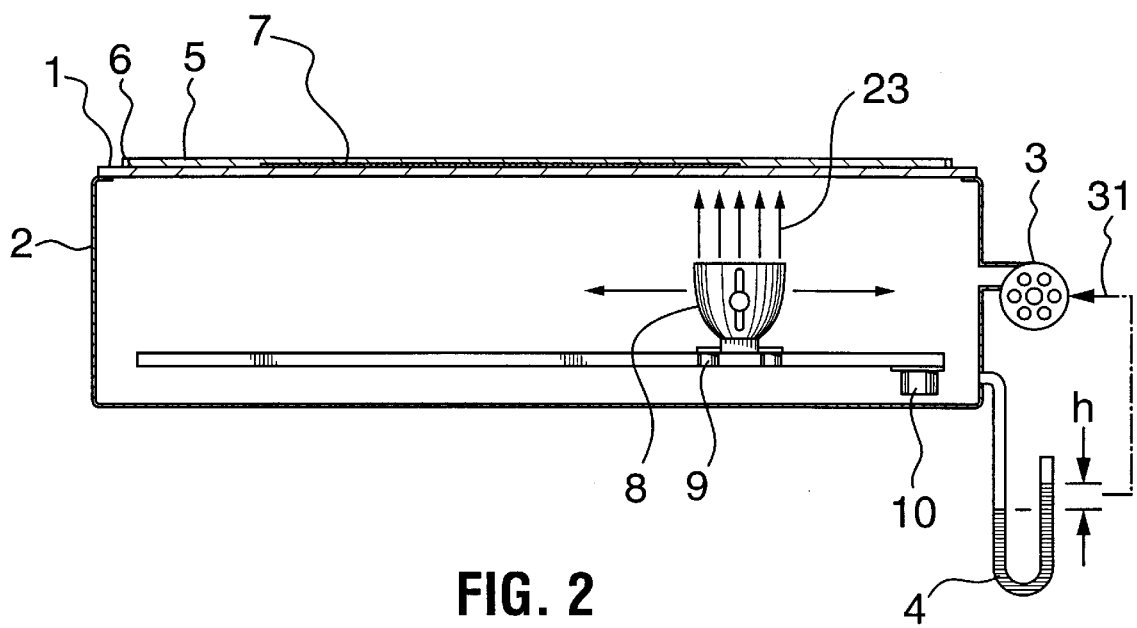
FIG. 2 is a cross section of the apparatus of FIG. 1 showing regulation of air pressure using a pressure gauge; and, FIG. 3 is a cross section of an apparatus according to the invention showing regulation of air pressure using an optical flatness sensor.

Air pressure within enclosure 2 can be controlled manually or automatically. For manual control, a pressure gauge 4 in FIG. 2 is observed and a speed of blower 3 is adjusted by means of a suitable manual control (not shown) to achieve an air pressure within enclosure 2 sufficient to render the top surface of plate 1 flat. As an alternative to adjusting the speed of blower 3, the size of an air inlet or outlet from enclosure 2 may be adjusted to vary the air pressure within enclosure 2. As long as the polymer thickness is not changed the blower setting can stay the same. For good sensitivity it is best to use a U-tube type manometer pressure gauge (a transparent tube filled with a liquid such as water and bent in the shape of the letter U, as shown in FIG. 2). Blower 3 is adjusted to set the difference in liquid height between the two arms of the tube 4 (shown as "h") to be equal to the value predicted by the above formula.

A control system may be provided to control the difference between the air pressure within enclosure 2 and the air pressure outside of enclosure 2. For example, if pressure gauge 4 is replaced with a gauge which produces an electrical output signal which varies with pressure, this output signal can be used to control the speed of blower 3 to a pre-selected set point via a feedback link 31. Suitable feedback systems are well known in the art and the components are commercially available, for example from Omega Engineering (Stamford, Conn.).

Figure 3:
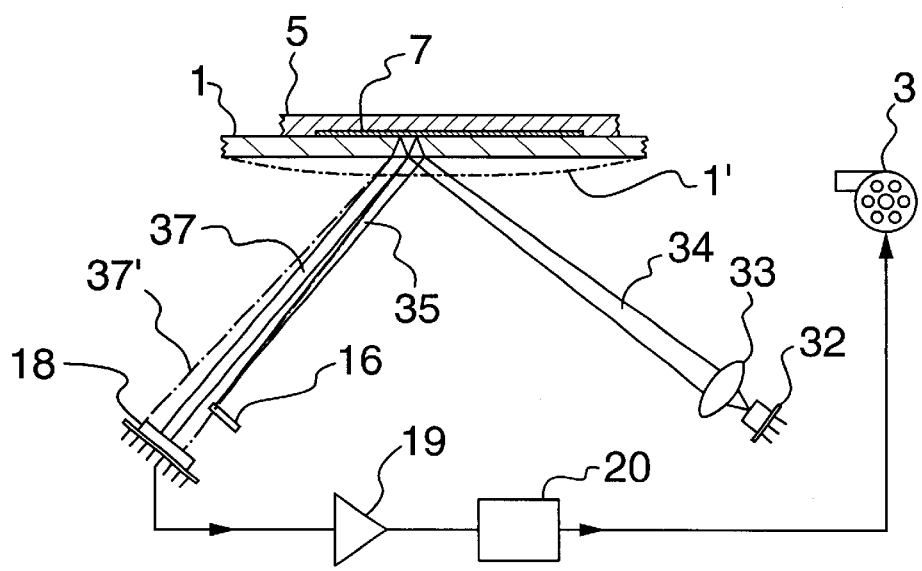

A further refinement is shown in FIG. 3. In the apparatus of FIG. 3, the flatness of plate 1 is monitored directly. An electrical output from a flatness sensor is used to control blower 3 (or a variable flow restrictor), instead of measuring air pressure within enclosure 2. The flatness of plate 1 may be monitored by any one of many commercial optical flatness sensors. An advantage of an optical sensor is that it can monitor the flatness of the top surface of plate 1 while mounted below plate 1. This requires only the top surface of plate 1 to be accurately made. Measuring the flatness of the top surface of plate 1 directly allows blower 3 to be controlled by a controller which keeps the top surface of plate 1 flat regardless of the thickness of the polymer (i.e. there is no need to know the density or thickness of polymer 5). By way of example, such a control circuit is shown, using the collimation of a reflected laser beam as a measure of the flatness of plate 1.

In FIG. 3, a glass plate 1 is covered with a mask comprising an exposed and developed photographic film 7 and a layer of a liquid polymer 5. Laser diode 32 generates a light beam 34 via lens 33. Diode 32, lens 33 and beam 34 may be of the type commonly used in hand-held laser pointers or of a similar type. Beam 34 is approximately collimated, however perfect collimation is not necessary. Beam 34 is reflected off both surfaces of glass plate 1. The reflection 35 from the bottom surface of plate 1 is blocked by a light stop 16. The reflection 37 from the top surface of plate 1 is captured by a detector 18 which measures the diameter of the reflected beam. The system is calibrated with support plate 1 flat. The diameter of beam 17 which results when support plate 1 is flat is found.

The signal from detector 18 is amplified by amplifier 19 and supplied to a controller 20 which adjusts the speed of blower 3 in a conventional feedback control circuit. Should support plate 1 sag of support plate 1 as shown in 1', beam 37 will widen as shown by 37'. The wider beam 37' causes a larger signal from size detector 18. This causes controller 20 to increase the speed of blower 3 to compensate for sag until the signal is back to its preset value. Detector 18 may comprise, for example, a position sensitive detector type or a CCD video camera. Systems for measuring the size of a light spot on a video camera are well known and are commercially available, for example from Data Translation (Marlborough, Mass.). Such systems will therefore not be described here.

This invention additionally provides a novel illumination system which may be used together with the above-noted pressurized enclosure or in systems for exposing photopolymer plates which do not use such a pressurized enclosure. As shown in FIG. 1, the preferred embodiment of the invention provides a small intense light source 8 for exposing photopolymer 5. Preferably light source 8 is equipped with a collimator so that photopolymer 5 can be exposed with collimated light. Light source 8 preferably comprises a small collimated metal-halide or mercury arc lamp source 8 (see FIG. 1). Suitable light sources are available from many suppliers (for example, Electro-Lite Corp of Danbury, Conn.). An advantage of this system of exposure is that it does not require any large optical elements. Large optical elements can be both heavy and expensive.

While light source 8 is energized to expose photopolymer 5, light source 8 can be moved relative to photopolymer 5 so that all parts of photopolymer 5 receive an adequate exposure to light from light source 8. Light source 8 is scanned so that edge regions of the portions of photopolymer layer 5 which are being exposed receive substantially the same illumination as central regions of the photopolymer layer. When large stationary light sources are used to expose photopolymer plates, the high cost of large, high quality optical components often forces design trade-offs which result in exposures dropping off in edge portions of the exposed areas.

Light source 8 brightly illuminates an area significantly smaller than all of the area of support plate 1. Light source 8 is mounted to a mobile stage. Even exposure of photopolymer 5 is achieved by moving light source 8 relative to photopolymer 5 while illuminating photopolymer 5. Light source 8 is moved in a pattern which results in the photopolymer receiving a substantially uniform illumination. Various patterns may be used. In the embodiment illustrated in FIG. 1, collimated light source 8 is mounted on a movable stage which comprises a motorized track 9. Motion of the light source 8 along track 9 is powered by motor 10. As light source 8 is driven along track 9 it is scanned over the full area of glass plate 1, preferably in a serpentine-like path. In the illustrated embodiments, motorized track 9 comprises the X-axis of an X-Y positioner 11 controlled by a computer or other automatic controller. Suitable motorized tracks are commercially available from many sources, for example, Newport Corp., of Irvine, Calif. As an alternative to an X-Y positioner, the invention could be practised with a motorized track which extends in a serpentine or spiral path so that light source 8 is scanned over the area of support plate 1 as it is moved along the track.

While the area of support plate 1 may be large enough to handle very large polymer plates, in many cases it will be desired to make a polymer plate which is significantly smaller than support plate 1. Sometimes film 7 will cover only a small portion of plate 1. An advantage of preferred embodiments of this invention is that the motion of light source 8 may be controlled to evenly illuminate the area of the polymer plate being made without illuminating peripheral areas of support plate 1. This shortens the exposure process because the light from light source 8 is concentrated on the polymer plate being made instead of being spread over support plate 1. It makes more efficient use of the light generated by light source 8 because light from light source 8 does not uselessly illuminate parts of support plate 1 where there is no photopolymer 5 requiring exposure.

Figure 5:
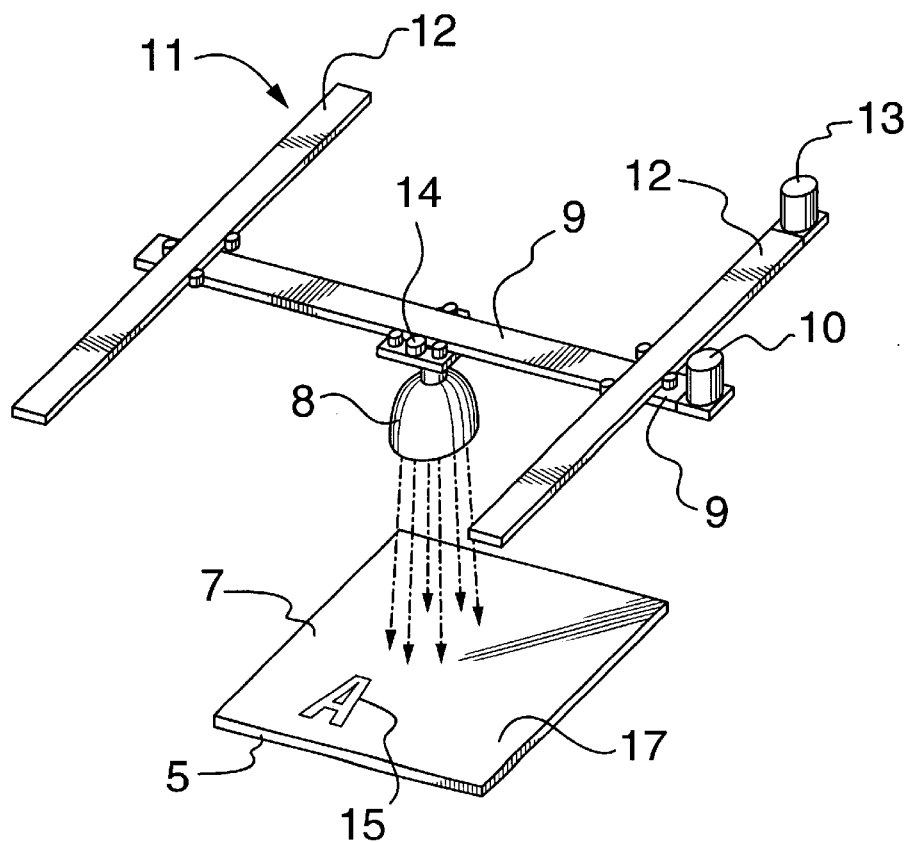
FIG. 5 is a partially schematic top perspective view of apparatus for exposing a photopolymer plate from above according to an alternative embodiment of the invention.

FIG. 5 shows an alternative embodiment of the invention wherein a light source 8 mounted to an X-Y positioner 11 which is supported above a support surface carrying a layer of photopolymer 5. X-Y positioner 11 has an X-axis track 9 on which light source 8 is mounted. A motor 10 controls the position of light source 8 along track 9. Track 9 is mounted perpendicularly to Y-axis tracks 12. The position of track 9 along Y-axis tracks 12 is controlled by a motor 13. In the embodiment of FIG. 5, a mask 7 overlies a layer of photopolymer 5. Mask 7 has transparent areas 15 and opaque areas 17. Light from light source 8 exposes photopolymer 5 beneath transparent areas 15. Mask 7 may be separate from the layer of photopolymer 5 or may be integrated with photopolymer 5 in a plate.

Figure 6A:
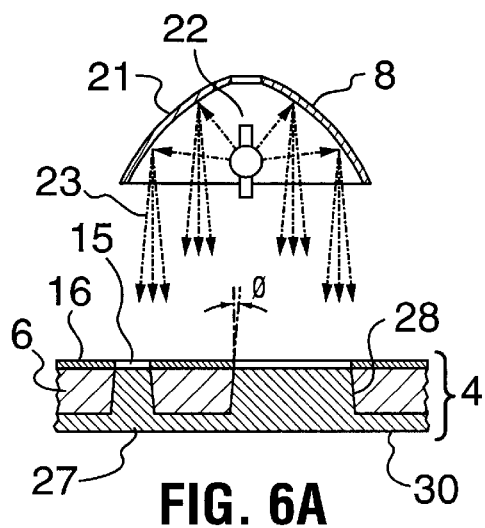
FIGS. 6A and 6B illustrate the effect of varying the collimation of light used to expose a photopolymer.
Figure 6B:
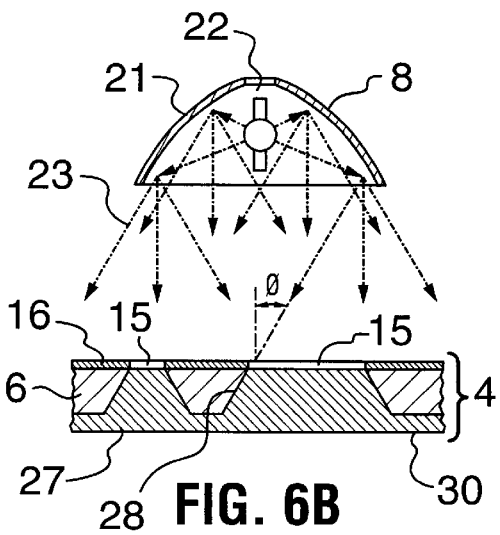

Preferably light source 8 includes a collimator which is variable. In the embodiment of FIG. 5, a motor 14 controls the collimation of light emitted by light source 8. FIGS. 6A and 6B illustrate the effect of varying the collimation of light source 8. As shown in FIGS. 6A and 6B light source 8 may comprise a lamp 22 which is movable on the axis of a reflector 21. The collimation of light 23 from light source 8 may be varied by moving lamp 22 axially relative to reflector 21.

Light source 8 emits light 23 which exposes a plate through a mask 7. The plate comprises a photopolymer 5 on a base 30. When light source 8 is set to provide collimated light, as shown in FIG. 6A, light rays 23 are incident nearly perpendicularly to mask 7 and the shadows created by opaque parts 17 of mask 7 tend to be sharp. This tends to cause exposed portions 27 of photopolymer 5 to have steep sides 28, as indicated by the small angle θ in FIG. 6A.

When light source 8 is set to provide light which is not highly collimated, as shown in FIG. 6B then the exposed portions 27 of photopolymer 5 tend to have more gradual sides, as indicated by the angle φ of FIG. 6B which is significantly greater than θ. When the light is not collimated, some of light rays 23 are incident at angles to the surface of mask 7. Such light rays can expose photopolymer 5 which underlies opaque regions 16 of mask 7 to yield gently sloping side faces 28 on exposed features 27 in photopolymer 5. Thus, by adjusting the collimation of light emitted by light source 8, the cross sectional profiles of features 27 in the exposed photopolymer plates and, consequently, the mechanical properties of exposed features 27 in photopolymer 5 can be adjusted.

Figure 7A:
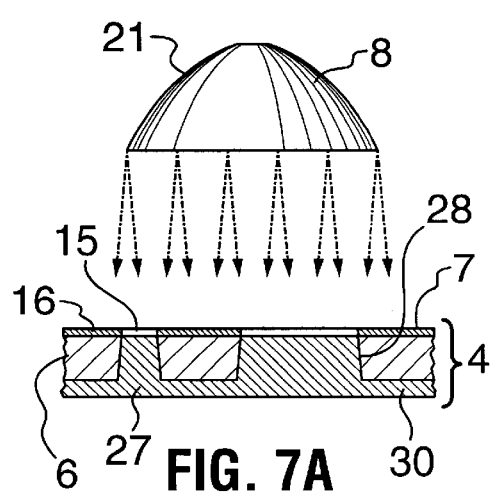
FIGS. 7A and 7B illustrate steps in a two step procedure for exposing a photopolymer plate; and, FIG. 8 is a section through a portion of a polymer plate exposed by the procedure illustrated in FIGS. 7A and 7B.
Figure 7B:
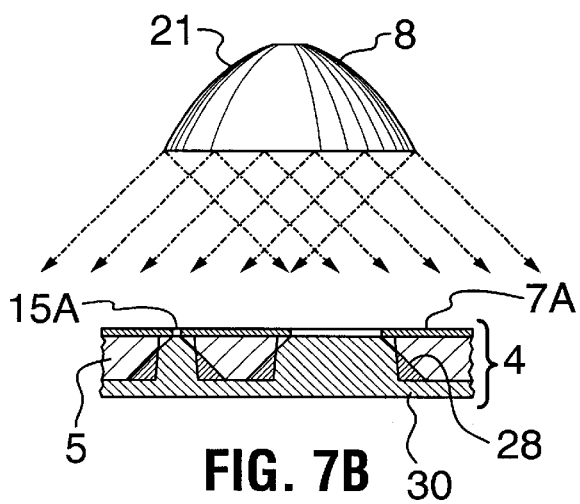
Figure 8:
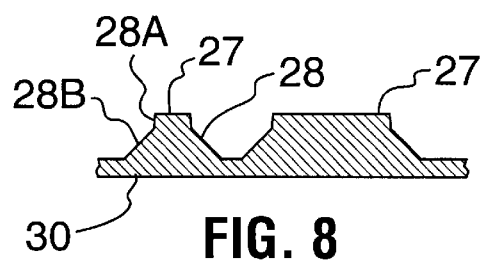

As shown in FIGS. 7A and 7B, a photopolymer plate can be exposed in two stages. In one stage a photopolymer 5 is exposed to collimated light through a mask 7 having larger transparent areas 15. In another stage the photopolymer is exposed to light which is not as highly collimated through a mask 7A having transparent areas 15A which correspond to but are smaller than transparent areas 15. The result is the creation of features in the exposed polymer 27 which have side faces 28 having steep upper portions 28A and more gradually sloping lower portions 28B. Providing features which have steep side faces in their upper portions is desirable in printing plates as it can provide crisper printing. Providing exposed features 27 which are buttressed by the more gradually sloping lower portions of faces 28 can make printing plates which are more durable than would be the case if the features had side faces 28 which were steeply inclined all of the way to base 30.

In preferred embodiments all key components of the invention such as blower, exposure system etc., are computer controlled. Preferably apparatus for practising the invention includes a computer controller which controls a movable stage, such as X-Y positioner 11, to achieve relative motion, in at least two dimensions, of light source 8 and the photopolymer being exposed. Most preferably the controller allows a user to select an area to be exposed and, in response, the controller moves light source 8 to achieve substantially even illumination of the selected area without wasting energy by unnecessarily illuminating other areas. For example, the controller may cause the X-Y positioner to scan light source 8 across an area to be exposed in a pattern comprising a number of parallel lines. Light source 8 may be scanned over the area to be exposed more than once during each exposure to even out the exposure of the photopolymer 5. Light source 8 may be driven on a different path each time it is scanned over the area to further even out the exposure delivered to photopolymer 5. Various ways to achieve computer control of X-Y positioners and other elements is well known to those skilled in the art and will therefore not be described herein.

As will be apparent to those skilled in the art in the light of the foregoing disclosure, many alterations and modifications are possible in the practice of this invention without departing from the spirit or scope thereof. For example, exposure systems according to the invention which include a movable light source have applications in exposing photpolymer plates generally and are not limited to use with pourable liquid photopolymers. While such exposure systems may be used in combination with a flat support plate which is prevented from sagging by an air pressure differential, as described above, such a support plate is not required for the use of exposure systems according to this invention. While the polymer being exposed has been described as being flat, an exposure system according to the invention could also be used to expose polymer surfaces having other configurations. Accordingly, the scope of the invention is to be construed in accordance with the substance defined by the following claims.

What is claimed is:

1. A method of exposing a photopolymer, the method comprising:
   a) providing a light source;
   b) providing a layer of photopolymer supported on a first side of a light-transmitting support plate above the light source;
   c) operating the light source to generate an unfocused beam of ultraviolet light and thereby exposing an underside of the photopolymer to the ultraviolet light while moving the light source in at least two dimensions to evenly expose a region of the photopolymer to the ultraviolet light; and,
   d) while exposing the underside of the photopolymer to the ultraviolet light, maintaining the support plate planar by creating a pressure differential between the first side and a second side of the support plate.

2. The method of claim 1 wherein the light source comprises an arc lamp and a reflector.

3. The method of claim 1 wherein the light source is mounted to an X-Y positioner and moving the light source comprises operating the X-Y positioner to move the light source along a plurality of parallel paths while illuminating portions of the photopolymer lying along the paths with the ultraviolet light.

4. The method of claim 1 wherein the support plate comprises a sheet of glass.

5. The method of claim 1 wherein the light source comprises a variable collimator and the method comprises exposing the photopolymer a first time with the variable collimator at a first setting and a second time with the variable collimator at a second setting different from the first setting.

6. The method of claim 1 wherein the light source comprises a variable collimator and the method comprises:
   a) providing first and second masks having areas substantially opaque to ultraviolet light and areas substantially transparent to ultraviolet light, the transparent areas in the first mask corresponding to and being slightly larger than the transparent areas in the second mask;
   b) inserting the first mask between the light source and the photopolymer layer, and exposing the photopolymer layer to ultraviolet light from the light source with the collimator set to provide light of a first degree of collimation incident on the mask; and,
   c) inserting the second mask between the light source and the photopolymer layer, and exposing the photopolymer layer to ultraviolet light from the light source with the collimator set to provide light of a second degree of collimation, less than the first degree of collimation, incident on the mask;

wherein the steps of inserting the first mask and inserting the second mask are performed in any order.

7. The method of claim 1 comprising maintaining the light source equidistant from a surface of the photopolymer while exposing the photopolymer to the ultraviolet light.

8. The method of claim 1 wherein the method comprises providing a mask having opaque areas and radiation-transmitting areas between the photopolymer and the light source.

9. Apparatus for curing a photopolymer, the apparatus comprising:
   a) a light source, the light source emitting an unfocused beam of actinic radiation when energized;
   b) a movable stage supporting the light source, the movable stage capable of moving the light source in at least two dimensions on a surface of motion;
   c) a light-transmitting support surface for supporting a photopolymer plate, the support surface parallel to, and positioned above, the surface of motion of the light source and defining an upper side of a closed volume;
   d) a flatness sensor generating a signal variable with a flatness of the support surface; and,
   e) a source of pressurized air connected to the closed volume and controlled in response to the signal to maintain the support surface flat.

10. The apparatus of claim 9 wherein the support surface and surface of motion of the light source are planar.

11. The apparatus of claim 9 wherein the light source comprises a variable collimator.

12. The apparatus of claim 9 wherein the light source comprises an arc lamp and a reflector.

13. The apparatus of claim 12 wherein the arc lamp is movable relative to the reflector to allow a collimation of light emitted by the light source to be adjusted.

14. The apparatus of claim 12 wherein the light source comprises a metal halide lamp and a reflector.

15. The apparatus of claim 12 wherein the metal halide lamp is movable relative to the reflector to allow a collimation of light emitted by the light source to be adjusted.

16. The apparatus of claim 9 wherein the movable stage comprises an X-Y positioner controlled by a computer.

17. The apparatus of claim 16 wherein computer is programmed to cause the X-Y positioner to scan the light source across an area of a photopolymer plate along a plurality of parallel lines.

* * * * *